(12) United States Patent
Nishikawa et al.

(10) Patent No.: US 7,180,007 B2
(45) Date of Patent: Feb. 20, 2007

(54) ELECTRONIC CIRCUIT DEVICE AND ITS MANUFACTURING METHOD

(75) Inventors: Kazuhiro Nishikawa, Osaka (JP); Norihito Tsukahara, Kyoto (JP); Masayuki Okano, Hyogo (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 215 days.

(21) Appl. No.: 10/860,653

(22) Filed: Jun. 4, 2004

(65) Prior Publication Data
US 2005/0017373 A1 Jan. 27, 2005

(30) Foreign Application Priority Data
Jun. 6, 2003 (JP) .............................. 2003-161802

(51) Int. Cl.
*H05K 1/09* (2006.01)
(52) U.S. Cl. ...................................... 174/257
(58) Field of Classification Search ................ 174/257, 174/260, 261
See application file for complete search history.

(56) References Cited

U.S. PATENT DOCUMENTS 5,972,735 A * 10/1999 Dominic ..................... 438/118
6,663,946 B2 * 12/2003 Seri et al. ................... 428/209
2002/0134584 A1 * 9/2002 Higuchi et al.
2002/0166685 A1 * 11/2002 Miyamura et al.

FOREIGN PATENT DOCUMENTS

| JP | 62-2593 | | 1/1987 |
| JP | 3-136290 | | 6/1991 |
| JP | 07-030236 | | 1/1995 |
| JP | 09-017601 | * | 1/1997 |
| JP | 2000-204263 | * | 7/2000 |

* cited by examiner

*Primary Examiner*—Dean Reichard
*Assistant Examiner*—Yuriy Semenenko
(74) *Attorney, Agent, or Firm*—McDermott Will & Emery LLP

(57) ABSTRACT

It comprises circuit board 10 with circuit pattern 2 formed by conductive resin paste on resin substrate 1, surface-mounted type electronic components 30, 40 arranged with electrode terminals with respect to the connecting region of circuit pattern 2, connecting member 3 formed from conductive resin paste for connecting the connecting region to the electrode terminal, and insulating adhesive 6 for bonding the electronic components 30, 40 and circuit board 10, which is lower in curing temperature than conductive resin paste and disposed in a space between circuit board 10 and electronic components 30, 40 between connecting regions.

8 Claims, 2 Drawing Sheets

ELECTRONIC CIRCUIT DEVICE AND ITS MANUFACTURING METHOD

FIELD OF THE INVENTION

The present invention relates to an electronic circuit device mounted with electronic components on a circuit board wherein circuit patterns of conductive resin paste are formed on a resin substrate, and a manufacturing method for the same.

BACKGROUND OF THE INVENTION

A conventional printed wiring board is a board with a metallic foil affixed to a resin substrate made from a composite material such as epoxide woven glass, epoxide cellular paper, phenolic cellulose paper or polyimide woven glass, and for example, affixing copper foil thereto, a circuit board is formed by etching the copper foil in a predetermined pattern. Electronic components are arranged in predetermined positions on the circuit board, and electrode terminals of the electronic components are connected by soldering to electrode terminals of the circuit board, thereby electrical connecting and fixing of the components in order to manufacture an electronic circuit device. In such a method, the resin substrate is required to endure the temperature (about 250° C.) for soldering. Also, it is necessary to make equipment investment for a reflow device, cleaning device or exhaust gas treating equipment. Further, since lead (Pb)-tin (Sn) type solder widely used in general involves an environmental problem, solder that contains no lead such as tin (Sn)—silver (Ag)-copper (Cu) is used for soldering. However, the melting temperature of such solder is in many cases higher than that of conventional eutectic solder, and the resin substrate is further required to be higher in heat resistance.

On the other hand, the prevalence of mobile equipment such as portable telephones in particular is very remarkable, and further, for achieving the purposes of reduction in size and weight and higher function, there is a strong demand for high performance and high-density mounting with respect to a circuit board as well. Accordingly, in order to mount as many electronic components as possible in a limited space in a portable telephone or the like, it is becoming necessary for a flexible printed circuit board.

Further, with the recent prevalence of digital camera, compact disk (CD) drive or digital versatile disk (DVD) drive, components such as plastic lenses which are relatively low heat resistance are often mounted on a circuit board. Such components of low heat resistance cannot be subjected to reflow soldering together with ordinary electronic components. Therefore, a conventional method is such that general electronic components including semiconductor elements are connected by reflow soldering, while components of low heat resistance such as plastic lenses are connected by using conductive resin paste. Thus, the components are mounted separately, and there arises a problem that the mass productivity cannot be improved.

On the other hand, the following method is disclosed in Japanese Laid-open Patent S62-2593. That is, conductive resin paste with conductive particles contained in resin is used to form a circuit pattern on the surface of a circuit board where electronic components are mounted. Subsequently, as the conductive resin paste is not dried, electronic components are arranged in such manner that the electrode terminals of the electronic components come in tight contact with the conductive resin paste surface that serves as the electrode terminals on the circuit pattern. After that, the conductive resin paste is cured by heating, thereby forming the finally cured circuit pattern and at the same time making the electrical and mechanical connection with the electronic components. In this method, since conductive resin paste is used, it is not necessary to be heated up to the solder reflow temperature, and a thin circuit module having a smooth surface can be realized.

Also, the following method is disclosed in Japanese Laid-open Patent H3-136290. A plurality of electronic components are arranged in such manner that the electrode terminals of these electronic components are flush with each other, which are integrally formed and secured with resin molding material including the surfaces of electronic components other than electrode terminals. Exposed electrode terminal surfaces and circuit patterns for connecting these electronic components to each other are formed by printing with use of conductive resin paste. In such a method, various electronic components can be formed together with the circuit pattern of the board by using conductive resin paste instead of soldering. Accordingly, it is possible to mount various electronic components at a relatively low temperature the same as in the above method.

However, in the first example, the electronic components are arranged while the conductive resin paste of the circuit pattern on the board is not cured, and after that the conductive resin paste is cured to make the electrical and mechanical connection with the conductive resin paste. However, when general conductive resin paste is used, it is unable to increase the adhesion between the electronic component and the circuit board. Therefore, the occurrence of disconnection between the terminals is prevented by covering the electronic components with ultraviolet setting resin.

Also, in the second example, a plurality of electronic components are connected and formed together with circuit patterns by using conductive resin paste, but it is executed after burying the electronic components in resin molding. When the electronic components are buried in resin molding material, positional deflection is liable to take place between the electronic components. In case of such positional deflection, it will often cause positional deflection between the electrode terminal of the electronic component and the circuit pattern when printed. Particularly, when many electronic components are arranged or the electronic component used has many terminals, the influence of positional deflection is remarkable. That is, in such a method, it is difficult to form circuit patterns at fine pitches and to mount electronic components in high density.

The purpose of the present invention is to provide an electronic circuit device which is inexpensive and excellent in mass-productivity and capable of mounting various electronic components together including electronic components of weak heat resistance, and a manufacturing method for the circuit device.

SUMMARY OF THE INVENTION

The electronic circuit device of the present invention comprises:

a circuit board with a circuit pattern formed by conductive resin paste containing conductive particles and resin on a resin substrate;

a surface-mounted type electronic component arranged with an electrode terminal positioned with respect to a connecting region of the circuit pattern;

a connecting member formed from conductive resin paste disposed between the connecting region and the electrode terminal; and insulating adhesive for bonding the electronic component to the circuit board, which is disposed in a space between the circuit board and the electronic component within the connecting region and has a curing temperature lower than that of the conductive resin paste.

In this configuration, it is possible to make the heat setting temperature for forming the circuit pattern of the circuit board and mounting the surface-mounted type electronic component onto the circuit board lower than the curing temperature of the conductive resin paste. Consequently, a resin substrate of low heat resistance can be used, and in addition, electronic components of low heat resistance can be mounted together with various chip components and semiconductor integrated circuit elements, and it is possible to greatly improve the efficiency of the mounting operation.

For example, electronic components of low heat resistance such as plastic lenses can be mounted together with electronic components of high heat resistance such as chip resistors and chip capacitors on a board of relatively low heat resistance such as polyethylene terephthalate (PET) film.

Also, the method of manufacturing the electronic circuit device of the present invention includes the steps of:

forming a circuit board by forming a circuit pattern on a resin substrate by using conductive resin paste containing conductive particles and resin;

applying conductive resin paste as a connecting member for connection between connecting region and electrode terminal on a connecting region of the circuit pattern or on an electrode terminal of a surface-mounted type electronic component;

applying insulating adhesive having a curing temperature lower than the curing temperature of conductive resin paste on the resin substrate between the connecting regions;

arranging an electronic component on the circuit board, positioning the connecting region to the electrode terminal of the electronic component; and heat-setting at least the connecting member and the insulating adhesive with the temperature increased in order to mount the circuit pattern and the electrode terminal and to bond the circuit board and the electronic component together.

In this method, since the electronic circuit device can be manufactured at temperatures lower than the curing temperature of the conductive resin paste, a resin substrate of low heat resistance can be used and in addition electronic components of low heat resistance can be mounted together with various chip components and semiconductor integrated circuit elements, and thereby, the manufacturing process can be simplified.

DETAILED DESCRIPTION OF THE EXEMPLARY EMBODIMENT

The exemplary embodiments of the present invention will be described in the following with reference to the drawings. Like numerals refer to like elements throughout, and the description is sometimes omitted.

First Exemplary Embodiment

FIG. 1A to FIG. 1D are sectional views for describing the main processes in the manufacturing method for an electronic circuit device in the first exemplary embodiment of the present invention. In this exemplary embodiment, an electronic circuit device with two electronic components 30, 40 mounted on circuit board 10 is described, but there is no particular limitation on the number of electronic components mounted, and it is preferable to mount more electronic components.

Figure 1A:
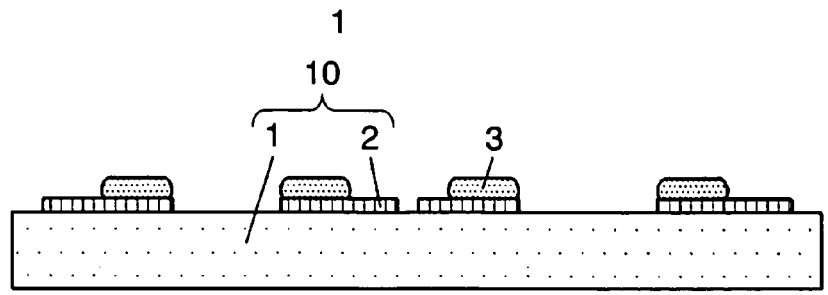
FIG. 1A is a sectional view of a circuit board used in the manufacturing method for an electronic circuit device in the first exemplary embodiment of the present invention.

FIG. 1A is a sectional view of circuit board 10 with connecting member 3 formed on the connecting region of circuit pattern 2 which is used for an electronic circuit device of the present exemplary embodiment. Circuit board 10 is manufactured by using conductive resin paste of resin and conductive particles to form, for example, predetermined circuit pattern 2 by screen printing on resin substrate 1. Circuit pattern 2 is preferable to be cured under heat immediately after printing, or cured together with connecting member 3 and insulating adhesive 6 to be cured under heat as described later. In this exemplary embodiment, circuit board 10 is formed with single-layer circuit pattern 2 on one side only, but the present invention is not limited to this configuration. For example, it is preferable to form the circuit pattern on both sides, and further, to employ a multi-layer wiring configuration.

After that, connecting member 3 is formed by using same conductive resin paste on the connecting region where electronic components 30, 40 of circuit pattern 2 are mounted. For this forming purpose, a drawing system for example is preferable, but it is also possible to employ a screen printing or ink jet system.

Figure 1B:
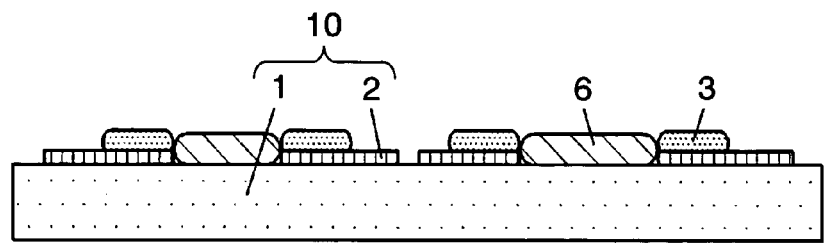
FIG. 1B is a sectional view of a circuit board with insulating adhesive formed between connecting regions in the manufacturing method for an electronic circuit device in the first exemplary embodiment.

FIG. 1B is a sectional view of a circuit board with insulating adhesive 6 further formed between the connecting regions. For forming insulating adhesive 6, a drawing system for example is preferable, but it is also possible to employ a screen printing or ink jet system. In this case, insulating adhesive 6 used is a material whose curing temperature is lower than that of conductive resin paste. For example, as the insulating adhesive, it is preferable to use resin constituent prepared by eliminating conductive particles out of the conductive paste. This is because resin with conductive particles dispersed therein is higher in curing temperature as compared with resin only. Thus, when they are finally cured together, insulating adhesive 6 can be cured at temperatures a little lower as compared with the conductive resin paste. Accordingly, electronic components 30, 40 bonded with insulating adhesive 6 are cured before curing connecting member 3. As a result, it is possible to reliably bond and secure circuit board 10 and electronic components 30, 40 with insulating adhesive 6, and to electrically connect electronic components 30, 40 and the circuit pattern with connecting member 3 in a continuous fashion.

Figure 1C:
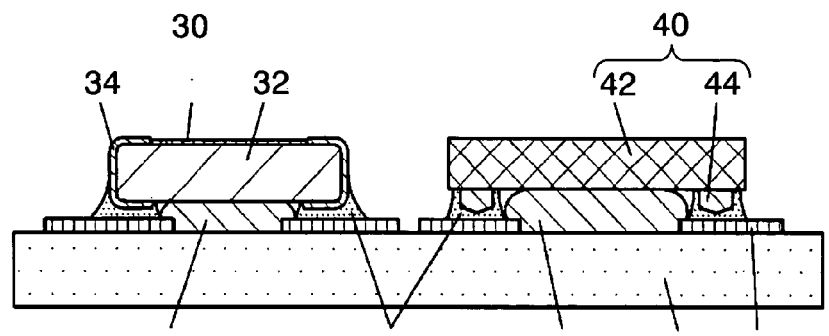
FIG. 1C is a sectional view of a circuit board with electronic components mounted thereon in the manufacturing method for an electronic circuit device in the first exemplary embodiment.

FIG. 1C is a sectional view of circuit board 10 with two electronic components 30, 40 mounted thereon. In this exemplary embodiment, one electronic component 30 out of the two components is a passive component of chip type. The electronic component 30 is configured in that resistor element 36 for example is formed on the surface of substrate 32, and electrode terminal 34 formed including the end portion is electrically connected to resistor element 36 and extended to the bottom portion. This is called passive component 30 in the following. Also, the other electronic component 40 is a semiconductor integrated circuit element. The semiconductor integrated circuit element is configured in that bump 44 is formed at the electrode pad (not shown) of semiconductor chip 42. This is called semiconductor 40 in the following.

Passive component 30 makes electrical connection in particular by connecting member 3 between electrode terminal 34 and circuit pattern 2 of circuit board 10 which are disposed at either side. In this connecting method, electrode terminal 34 and circuit pattern 2 are positioned with each other in the connecting region, and passive component 30 is pushed toward circuit board 10 so that electrode terminal 34 and circuit pattern 2, passive component 30 and circuit board 10 come close enough to each other. This causes the conductive resin paste of connecting member 3 to spread and form a fillet. Also, insulating adhesive 6 is filled in the space between passive component 30 and circuit board 10.

Also, semiconductor 40 is positioned to the connecting region of circuit pattern 2 similarly with the face where bump 44 is formed opposed to circuit board 10. After positioning the same as in the case of passive component 30, as semiconductor 44 is pushed in toward circuit board 10, each bump 44 is peripherally covered with connecting member 3, and the space at the central region of semiconductor 40 is filled with insulating adhesive 6.

In this condition, the whole is heated up to at least the curing temperature of the conductive resin paste. With the temperature increase by heating, insulating adhesive 6 first cures and each of passive component 30 and semiconductor 40 is bonded to circuit board 10. Subsequently, connecting member 3 begins to cure, then electrode terminal 34 is connected to circuit pattern 2, and bump 44 is connected to circuit pattern 2, thereby obtaining an electronic circuit device having the desired circuit function.

As conductive resin paste, for example, a material based on epoxy resin and paste-formed for printing by dispersing solvent and silver (Ag) particles can be used. Further, besides silver (Ag) particles, it is possible to use most of metallic materials that can be processed into fine particles such as gold (Au), platinum (Pt), copper (Cu), nickel (Ni), tin (Sn), tungsten (W) or molybdenum (Mo).

Specifically, for example, it is possible to use one-liquid type and solvent less conductive resin paste manufactured by using bisphenol type epoxy resin, curing agent, curing accelerator and filler, and dispersing conductive particles of silver (Ag) therein. This conductive resin paste has a curing temperature of 110° C. or lower and specific resistance 70 μΩcm and capable of forming a circuit pattern of low resistance on a polyethylene terephthalate (PET) resin substrate.

The curing temperature of conductive resin paste can be set in a relatively wide range according to the resin material used. However, if a resin material whose curing temperature is lower than 80° C. is used, it will be difficult to handle because the pot life of conductive resin paste is short. On the other hand, if a resin material whose curing temperature exceeds 110° C. is used, it is unable to use polyethylene terephthalate (PET) film for the board, and also, optical components of low heat resistance such as polyolefin lenses cannot be mounted together with other chip components. Accordingly, it is desirable to set the resin material so that the curing temperature of conductive resin paste ranges from 80° C. to 110° C.

Also, the curing temperature of insulating adhesive 6 is set a little lower as compared with the curing temperature of conductive resin paste. Passive component 30 and semiconductor 40 are first bonded to circuit board 10 by insulating adhesive 6, followed by terminal connection with connecting member 3 hardened, and thereby, low electric resistance and strong adhesion of the connecting region can be obtained.

The curing temperature of insulating adhesive 6 is required to be set in the following range. That is, in case the temperature difference between the curing temperature of insulating adhesive 6 and that of conductive resin paste is only less than 10° C., the conductive resin paste will begin to harden simultaneously when insulating adhesive 6 starts to harden. Such simultaneous curing will result in insufficient adhesion of insulating adhesive 6. As a result, the electric resistance of connecting member 3 will not become lessened. On the other hand, if the curing temperature of insulating adhesive 6 is lower than 50° C., the pot life of the paste will become shorter, making it difficult to handle. Accordingly, it is desirable to set the curing temperature of insulating adhesive 6 to 50° C. or over and to a range of temperatures lower by at least 10° C. than the curing temperature of conductive resin paste.

Such difference in curing temperature can be easily obtained by employing epoxy resin material used for conductive resin paste as insulating adhesive 6. That is, in the case of conductive resin paste, since conductive particles are dispersed in epoxy resin, the curing temperature is a little higher as compared with epoxy resin only. By utilizing such rise in curing temperature, the temperature range as mentioned above can be easily obtained.

Also, besides epoxy resin material, insulating adhesive 6 may sometimes include bisphenol type compound such as bisphenol A and bisphenol F, curing agent such as polyamine, latent curing agent such as amine adduct, and thixotropy imcomponenting agent such as aerosil. In case the viscosity of insulating adhesive 6 including such materials is less than 10 Pa·s, the printing stability during the printing operation such as drawing will worsen. Further, in the region where it comes in contact with conductive resin paste, connecting member 3 and insulating adhesive 6 may sometimes become mixed with each other. As a result, increasing of the electric resistance and lowering of the adhesion will take place in the region where they come in contact with each other.

On the other hand, if the viscosity is higher than 600 Pa·s, nozzle clogging or variation in amount of paste for printing is liable to take place. Accordingly, the viscosity of insulating adhesive 6 is required to be in a range from 10 Pa·s to 600 Pa·s.

Further, in case the thixotropic ratio (0.5/5.0 rpm, 25° C.) is less than 3, the pattern shape after printing of insulating adhesive 6 is liable to collapse, and the pattern shape retaining stability becomes deteriorated. On the other hand, if the thixotropic ratio is larger than 7, the pattern formed by printing has projections like horns, which will cause the adhesion to be lowered when electronic components are mounted. Therefore, the thixotropic ratio (0.5/5.0 rpm, 25° C.) is preferable to be set in a range from 3 to 7.

Figure 1D:
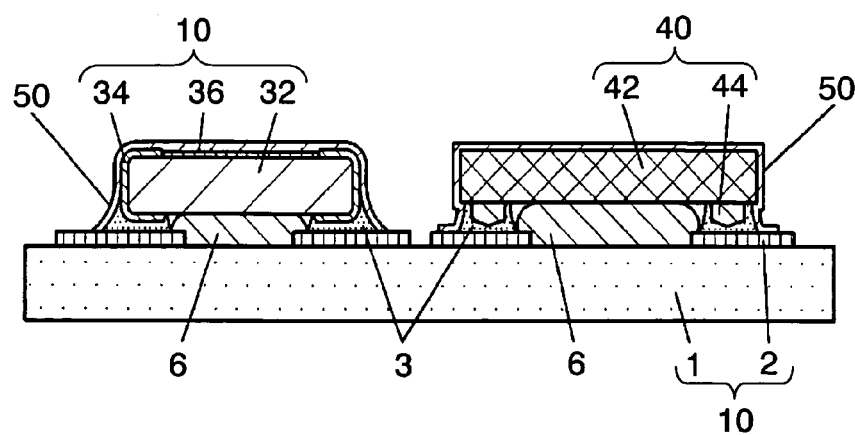
FIG. 1D is a sectional view of a circuit board with resin sealing layer formed so as to cover the entire surface of the electronic component in the manufacturing method for an electronic circuit device in the first exemplary embodiment.

FIG. 1D is a sectional view of resin sealing layer 50 formed so as to cover the entire surfaces of passive component 30 and semiconductor 40 thus formed. As resin sealing layer 50, a thin, fine and uniform layer can be formed by using cold radical polymer resin such as paraxylene and forming it into a layer of about 2 μm thick by a film forming method based on a dry process such as a chemical vapor-phase deposition (CVD) method at temperatures lower than 100° C. Resin sealing layer 50 thus formed has characteristics such as being low in water absorption, less in steam permeability and elasticity. The method of forming resin sealing layer 50 is not limited to CVD method, but for example it is also preferable to employ printing technology such as ink jet system and the like.

As described above, in this exemplary embodiment, a board of low heat resistance such as polyethylene terephthalate (PET) sheet can be used, and also, electronic components of low heat resistance such as plastic lenses can be mounted together with chip resistors, chip capacitors or semiconductor elements. Moreover, since the curing temperatures of conductive paste for circuit patterns, conductive paste for mounting, and insulating paste are lower than 110° C., it is possible to provide an electronic circuit which is less in thermal strain and stress, assuring excellent yield and low cost.

In this exemplary embodiment, an electronic circuit device comprising passive component 30 and semiconductor 40 has been described, but it is also preferable to further mount a plurality of passive components and semiconductors or electronic components of low heat resistance such as plastic lenses.

Next, the result of evaluating the characteristics of an electronic circuit device manufactured by the method in the present exemplary embodiment will be described in the following. As resin substrate 1, polyethylene terephthalate (PET) film is used. Circuit pattern 2 is formed on resin substrate 1 by using conductive resin paste based on bisphenol epoxy resin with conductive particles of silver (Ag) dispersed therein. After that, using same conductive resin paste, connecting member 3 is applied to the connecting region of circuit pattern 2, and further, insulating adhesive 6 is applied between the connecting regions. As insulating adhesive 6, resin material in conductive resin paste is used as paste for printing. In this condition, passive component 30 is positioned and arranged, which is pushed toward circuit board 10, and then the temperature is raised up to 100° C. for heating and curing. Due to the heating and curing, insulating adhesive 6 first begins to harden, and subsequently, connecting member 3 starts to cure. Accordingly, passive component 30 is bonded before connection is made at terminals.

Paraxylene as resin sealing layer 50 is formed by low temperature CVD method on the surface of the electronic circuit device thus manufactured.

Table 1 shows the result of evaluating the adhesion strength between passive component 30 and circuit board 10 with respect to shearing strength. Exemplary embodiment 1 is an electronic circuit device manufactured by the above process. Comparative example 1 is similarly the one manufactured by the above process, but it is configured in that no insulating adhesive is disposed between passive component 30 and circuit board 10. Comparative example 2 is configured in that passive component 30 is mounted by solder reflow on a conventional printed circuit board wherein no resin sealing layer is formed. As for the shearing strength, when a force is applied in a direction parallel to the passive component at normal temperature, and passive component 30 is removed from the board, the load is prescribed as the shearing strength.

TABLE 1

|  | Exemplary embodiment 1 | Comparative example 1 | Comparative example 2 |
| --- | --- | --- | --- |
| Shearing strength (g/chip) | 475 | 50 | 400 |

As is obvious in Table 1, it has been found that the shearing strength (475 g/chip) obtained in the exemplary embodiment 1 is greater than 400 g/chip of comparative example 2 that is a conventional system is obtained, and the adhesion strength obtained is more excellent. On the other hand, the shearing strength obtained in comparative example 1 is 50 g/chip. From these results, it has been confirmed that an electronic circuit device being excellent in adhesion strength can be realized by using polyethylene terephthalate (PET) film as a resin substrate with use of insulating adhesive.

Next, in the electronic circuit device having a configuration of exemplary embodiment 1, the effect on the reliability of resin sealing layer 50 has been evaluated. The results are shown in Table 2. In Table 2 are shown the results obtained with resin sealing layer and without resin sealing layer. In the reliability evaluation, while applying DC5V under atmospheric environment of 60° C., 90% humidity, the variations in electric resistance of the connecting region and in shearing strength between passive component 30 and the circuit board before and after lapse of 500 hours are measured. The evaluation results are shown by the ratio between the initial value and the measured value after lapse of 500 hours.

TABLE 2

|  | With resin sealing layer | Without resin sealing layer |
| --- | --- | --- |
| Electric resistance variation ratio | 1.11 | Resistance increase up to insulation |
| Shearing strength variation ratio | 1.36 | 0.06 |

As is obvious in Table 2, with resin sealing layer, the electric resistance variation ratio is 1.11 after lapse of 500 hours. That is, it is increased by only 11% as compared with the initial value, displaying excellent reliability. Also, the shearing strength variation ratio after lapse of 500 hours is 1.36. That is, the shearing strength after lapse of 500 hours is greater as compared with the initial value. This is probably because curing of the insulating adhesive is further promoted due to the temperature in an atmosphere of the testing environment.

On the other hand, without resin sealing layer, the electric resistance after lapse of 500 hours is $10^{15}$ Ω or over, increasing up to insulation. Also, similarly, the shearing strength after lapse of 500 hours is 0.06. That is, the adhesion strength is greatly lowered as compared with the initial value. Accordingly, it has been confirmed that the reliability can be remarkably improved by using resin sealing layer 50.

However, the present invention is not limited to a configuration using resin sealing layer 50 formed by low-temperature CVD method. For example, it is preferable to protect the surfaces of the passive component and semiconductor with resin film after they are mounted. Also, it is possible to assure practical reliability similarly by coating protective resin film that is an insulating material.

Second Exemplary Embodiment

FIG. 2A to FIG. 2D are sectional views of the main processes for describing an electronic circuit device and its manufacturing method in the second exemplary embodiment of the present invention.

Figure 2A:
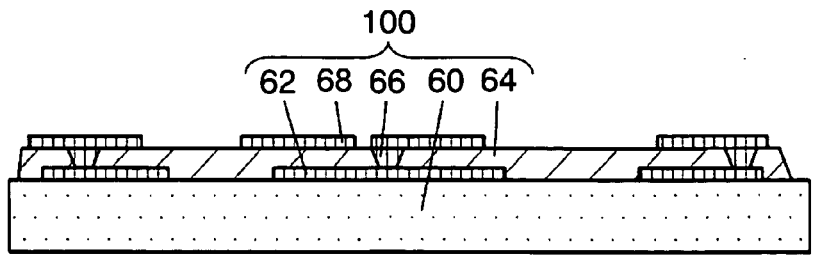
FIG. 2A is a sectional view of a circuit board with a circuit pattern of multi-layer wiring configuration formed on a resin substrate in the manufacturing method for an electronic circuit device in the second exemplary embodiment of the present invention.

FIG. 2A is a sectional view of circuit board 100 with a circuit pattern of multi-layer wiring configuration formed on a resin substrate 60. As shown in FIG. 2A, first circuit pattern 62 is formed on resin substrate 60 for example by screen printing with use of same conductive resin paste as in the first exemplary embodiment. The first circuit pattern 62 is printed on resin substrate 60, and then cured by heating up to 100° C.

Next, inter-layer insulating film 64 is formed by using insulating resin paste whose curing temperature is lower than that of the conductive resin paste. Inter-layer insulating film 64 is also cured by heating up to 100° C. or lower at least after printing. Via-hole 66 is formed at necessary portions when inter-layer insulating film 64 is formed.

After that, second circuit pattern 68 is formed by using same conductive resin paste. In this case, via-hole 66 is also filled with conductive resin paste. After that, it is cured by heating up to 100° C. As a result, on curing of the second circuit pattern 68, the conductive resin paste in via-hole 66 is also cured, thereby establishing conduction between the first circuit pattern 62 and the second circuit pattern 68. Circuit board 100 having circuit patterns of multi-layer wiring configuration is manufactured through these processes. Since the circuit board is manufactured through such processes, the highest temperature applied to resin substrate 60 during the processes is lower than the curing temperature of conductive resin paste, and therefore, circuit board 100 of high function can be manufactured by using a substrate of low heat resistance such as polyethylene terephthalate (PET) film with use of the material described in the first exemplary embodiment as the conductive resin paste.

In this exemplary embodiment, first circuit pattern 62, inter-layer insulating film 64, and second circuit pattern 68 are individually heated and cured, but the present invention is not limited to this method. For example, it is preferable to print them one after another in a state of being dried after printing, finally followed by heating and curing them together.

Figure 2B:
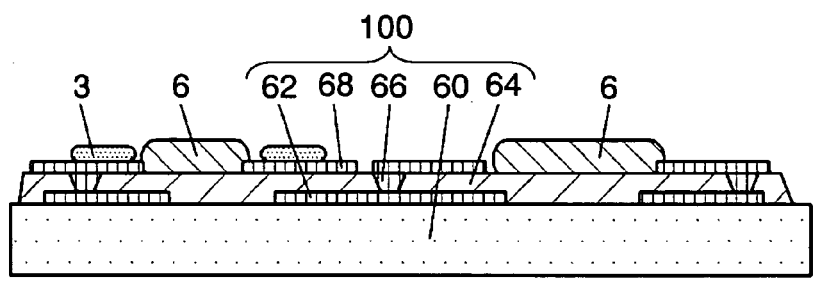
FIG. 2B is a sectional view of a circuit board with connecting member and insulating adhesive formed thereon in the manufacturing method for an electronic circuit device in the second exemplary embodiment.

FIG. 2B is a sectional view of connecting member 3 and insulating adhesive 6 formed on circuit board 100. As shown in FIG. 2B, connecting member 3 is formed by using same conductive resin paste on the connecting region where the electronic components of second circuit pattern 68 are mounted. For this forming purpose, a drawing system for example is preferable, but it is also possible to employ a screen printing or ink jet system. In this exemplary embodiment, connecting member 3 is not formed at the connecting region where semiconductor 40 is mounted, and after applying connecting member 3 of conductive resin paste at bump 44 side of semiconductor 40, semiconductor 40 is positioned to a predetermined position on circuit board 100. Accordingly, connecting member 3 is not formed at the connecting region where semiconductor 40 of FIG. 2B is mounted.

Next, insulating adhesive 6 is formed as shown in FIG. 2B between the connecting regions by using insulating resin paste. A drawing system for example is preferable for this forming, but it is also possible to employ a screen printing or ink jet system. As the insulating resin paste used for the purpose, a material whose curing temperature is at least lower than that of conductive resin paste is employed. For example, it is possible to use resin that is a constituent comprising conductive resin paste. This is because resin with conductive particles dispersed therein is higher in curing temperature as compared with resin only. Thus, when finally cured together, they can be cured at temperatures a little lower as compared with conductive resin paste. Accordingly, electronic components 30, 40 are first bonded by insulating adhesive 6 and cured, which is followed by curing of connecting member 3. Thus, circuit board 100 and electronic components 30, 40 can be bonded and secured by insulating adhesive 6, and electronic components 30, 40 and circuit patterns can be reliably electrically connected by connecting member 3 in a continuous fashion.

Figure 2C:
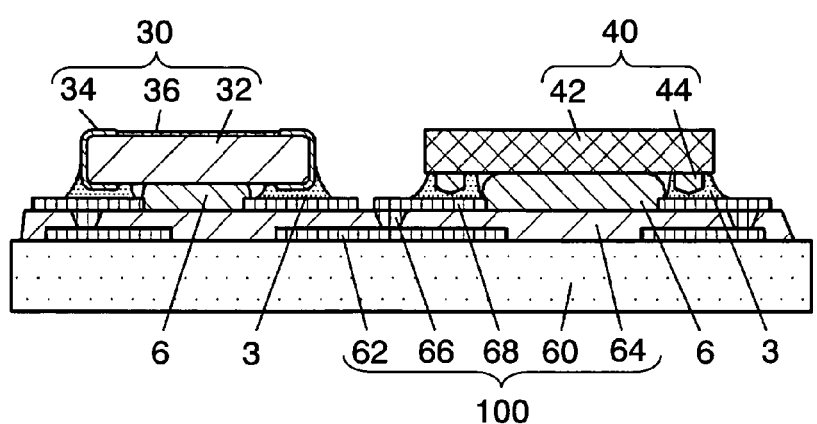
FIG. 2C is a sectional view of a circuit board with electronic components mounted thereon in the manufacturing method for an electronic circuit device in the second exemplary embodiment.

FIG. 2C is a sectional view of circuit board 100 mounted with two electronic components 30, 40. The process for mounting these electronic components 30, 40 will be described in the following by using FIG. 2C. In this exemplary embodiment, the same as in the first exemplary embodiment, how to mount passive component 30 and semiconductor 40 will be described.

Passive component 30 makes electrical connection in particular by connecting member 3 between electrode terminal 34 and the second circuit pattern 68 of circuit board 100, which is mechanically connected by insulating adhesive 6. In this connecting method, electrode terminal 34 and second circuit pattern 68 are positioned with each other in the connecting region, and passive component 30 is pushed so that electrode terminal 34 and second circuit pattern 68, passive component 30 and circuit board 100 come close enough to each other. This causes the conductive resin paste of connecting member 3 to spread and form a fillet. Also, insulating adhesive 6 is filled in the space between passive component 30 and circuit board 100.

Also, semiconductor 40 is positioned to the connecting region of second circuit pattern 68 similarly with the face where bump 44 is formed opposed to circuit board 100. After positioning the same as in the case of passive component 30, as it is pushed in toward circuit board 100, each bump 44 individually comes in contact with second circuit pattern 68 via connecting member 3, and the space at the central region of semiconductor 40 is filled with insulating adhesive 6.

In this condition, when the whole is heated up to at least the curing temperature of the conductive resin paste, insulating adhesive 6 first cures, then each of passive component 30 and semiconductor 40 is bonded to circuit board 100. Subsequently, connecting member 3 begins to cure, then electrode terminal 34 is connected to second circuit pattern

68, and bump 44 is connected to second circuit pattern 68, thereby obtaining an electronic circuit device having the desired circuit function.

Figure 2D:
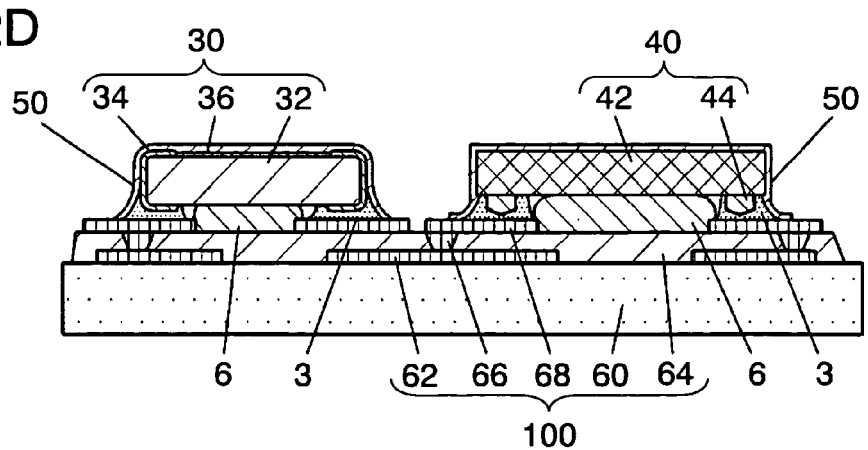
FIG. 2D is a sectional view of a circuit board with resin sealing layer formed so as to cover the entire surface of the electronic component in the manufacturing method for an electronic circuit device in the second exemplary embodiment.

FIG. 2D is a sectional view of resin sealing layer 50 formed so as to cover the entire surfaces of passive component 30 and semiconductor 40 of an electronic circuit device thus formed. As resin sealing layer 50, the same as in the first exemplary embodiment, a thin, fine and uniform layer can be formed by using cold radical polymerization material such as paraxylene and forming it into a layer of about 2 μm thick by a film forming method based on a dry process such as CVD method at 100° C. or lower.

Through the above processes, an electronic circuit device can be obtained, which has circuit board 100 with circuit patterns of multi-layer wiring configuration comprising the first circuit pattern and the second circuit pattern on resin substrate 60 and is mounted with electronic components 30, 40 on circuit board 100. In this electronic circuit device, resin of low heat resistance, for example, polyethylene terephthalate (PET) film is used and it is possible to execute the operations up to mounting various electronic components at temperatures lower than the curing temperature of the conductive resin paste, and components including plastic lenses or the like of low heat resistance can be mounted together. Also, since polyethylene terephthalate (PET) film is very inexpensive as compared with polyimide film widely used in general, making it possible to realize an electronic circuit device at low cost.

As thermoplastic resin film, polycarbonate (PC) resin or acrylonitrile-butadiene styrene (ABS) resin can be similarly employed instead of polyethylene terephthalate (PET).

Further, in the first exemplary embodiment and the second exemplary embodiment, the semiconductor is of bare chip configuration with bump formed thereon, but the present invention is not limited to this. It can be similarly mounted even in case of a package configuration such as QFP (Quad Flat Package) type, CSP (Chip Size Package) type or BGA (Ball Grid Array) type provided that it is surface-mounted type. Also, as for the passive components, not only chip resistors but common passive components such as chip capacitors and chip inductors and even plastic lenses can be similarly mounted, provided only that they are surface-mounted type.

Further, in the electronic circuit device of the present invention, the circuit board is preferable to be of multi-layer wiring configuration, comprising a circuit pattern having at least two layers formed by conductive resin paste and inter-layer insulating film formed between circuit pattern layers by insulating resin paste being lower in curing temperature than the conductive resin paste.

In this configuration, the operations for forming circuit pattern and inter-layer insulating film of multi-layer configuration and for mounting electronic components can be executed at temperatures at least lower than the curing temperature of the conductive resin paste. As a result, it is possible to realize an electronic circuit device of higher function by using a resin substrate of low heat resistance.

Also, as the insulating adhesive used for the electronic circuit device of the present invention, it is preferable to use a material whose main constituent is the resin of the above conductive resin paste. By using such a material, it is easy to make the curing temperature of the insulating adhesive lower than the curing temperature of the conductive resin paste. Also, it is possible to make the thermal expansion coefficient or the like of the insulating adhesive nearly equal to that of the conductive resin paste. Accordingly, it is possible to execute highly reliable mounting almost free from warp and deformation while connecting and bonding electronic components at temperatures lower than the curing temperature of the conductive resin paste.

Also, the insulating resin paste for forming the inter-layer insulating layer of the circuit board used for the electronic circuit device of the present invention is preferable to be the same material as for the insulating adhesive. Using same material, when the electronic circuit device is manufactured by mounting electronic components on a circuit board having a circuit pattern of multi-layer wiring configuration, it is possible to make the temperatures lower than the curing temperature of the conductive resin paste in all the manufacturing processes. Accordingly, various electronic components including electronic components of low heat resistance can be mounted together on a resin substrate of low heat resistance.

Also, as the insulating adhesive used for the electronic circuit device of the present invention, it is preferable to use a material containing bisphenol compound, curing agent, latent curing agent and thixotropy imcomponenting agent, of which the viscosity at 25° C. ranges from 10 Pa·s to 600 Pa·s and the thixotropic ratio (0.5/5.0 rpm, 25° C.) ranges from 3 to 7. By using such a material, it is possible to obtain insulating adhesive that may assure excellent adhesion strength and printability while curing at temperatures lower than the conductive resin paste. Consequently, even in case conductive resin paste for connecting electrode terminals of electronic components is arranged close to insulating adhesive, they hardly become mixed with each other, and variation of the respective characteristics hardly takes place. In this case, the viscosity of insulating adhesive is measured under two conditions of 0.5 rpm and 5.0 rpm at 25° C. atmosphere by using a viscometer, and the thixotropic ratio is defined as a ratio of these viscosity values.

Also, as the conductive resin paste used for the electronic circuit device of the present invention, it is preferable to use a material whose curing temperature is 80° C. to 110° C. By using such a material, the operations for manufacturing a circuit board and for mounting an electronic component can be executed at temperatures ranging from 80° C. to 110° C. mentioned above. Therefore, for example, a resin material of low heat resistance such as polyethylene terephthalate (PET) resin can be used as a resin substrate. As conductive resin paste of such curing temperature, for example, it is possible to use a one-liquid non-solvent type conductive resin paste manufactured by using bisphenol type epoxy resin, curing agent, curing accelerator, and filler, and dispersing conductive particles of silver (Ag) therein. This conductive resin paste has a curing temperature of 110° C. or lower and capable of forming a conductive circuit pattern whose specific resistance is 70 μΩcm on a polyethylene terephthalate (PET) resin substrate.

Also, in the electronic circuit device of the present invention, it is preferable to further include a resin sealing layer which covers the electronic component. In such a configuration, it is possible to protect the electronic component from high humidity atmosphere, thereby assuring long-lasting stability of electric resistance and adhesion of the connecting region. As a result, a highly reliable electronic circuit device can be realized.

Further, in the manufacturing method for an electronic circuit device of the present invention, the circuit board is preferable to be formed by forming a circuit pattern of at least two-layer configuration by using conductive resin paste and inter-layer insulating film by using insulating resin paste having a curing temperature lower than the curing temperature of the conductive resin paste between the circuit pattern layers, thereby forming a circuit pattern of multi-layer wiring configuration. In this method, it is possible to make the heating temperature during the manufacturing process of a circuit board of multi-layer wiring configuration lower than the curing temperature of the conductive resin paste. As a result, a resin substrate of low heat resistance can be used, and also, an inexpensive high-function electronic circuit device can be manufactured.

As described above, according to the present invention, including the operations for forming a circuit board and mounting a surface-mounted type electronic component onto a circuit board, it is possible to make the heating temperature for manufacturing an electronic circuit device lower than the curing temperature of conductive resin paste. As a result, a resin substrate of low heat resistance can be used, and also, electronic components of low heat resistance such as plastic lenses can be mounted together with chip components and semiconductor integrated circuit elements, and thereby, the manufacturing process can be greatly simplified.

What is claimed is:

1. An electronic circuit device, comprising: a circuit board with a circuit pattern formed on a resin substrate by using conductive resin paste containing conductive particles and resin; a surface-mounted type electronic component arranged with an electrode terminal positioned with respect to a connecting region of the circuit pattern; a connecting member formed from the conductive resin paste disposed between the connecting region and the electrode terminal; and an insulating adhesive for bonding the electronic component to the circuit board, which is disposed in a space between the circuit board and the electronic component in the connecting region, having a curing temperature lower than that of the conductive resin paste, wherein a curing temperature of the conductive resin paste ranges from 80° C. to 110° C., and the curing temperature of the insulating adhesive is no lower than 50° C. and at least lower than the curing temperature of the conductive resin paste.

2. The electronic circuit device of claim 1,
wherein the circuit board is of multi-layer wiring configuration having the circuit pattern of at least two-layer configuration formed by the conductive resin paste, and inter-layer insulating film formed between layers of the circuit pattern by using insulating resin paste that is lower in curing temperature than the conductive resin paste.

3. The electronic circuit device of claim 1,
wherein the insulating adhesive is a material whose main constituent is resin of the conductive resin paste.

4. The electronic circuit device of claim 2,
wherein the insulating resin paste uses a material that is same as for the insulating adhesive.

5. The electronic circuit device of claim 1,
wherein the insulating adhesive contains bisphenol compound, curing agent, latent curing agent, and thixotropy imcomponenting agent, which is 10 Pa·s to 600 Pa·s in viscosity at 25° C., and 3 to 7 in thixotropic ratio (0.5/5.0 rpm, 25° C.).

6. The electronic circuit device of claim 1, further comprising:
a resin sealing layer which covers the electronic component.

7. A manufacturing method for an electronic circuit device, including the steps of: forming a circuit board by forming a circuit pattern on a resin substrate by using conductive resin paste containing conductive particles and resin; applying conductive resin paste as a connecting member for connection between a connecting region and an electrode terminal on the connecting region of the circuit pattern or on an electrode terminal of a surface-mounted type electronic component; applying an insulating adhesive having a curing temperature lower than the curing temperature of the conductive resin paste to the resin substrate between the connecting regions; arranging the electronic component on the circuit board, positioning the connecting region to the electrode terminal of the electronic component; and heat-setting at least the connecting member and the insulating adhesive in order to mount the circuit pattern and the electrode terminal and to bond the circuit board and the electronic component together, wherein a curing temperature of the conductive resin paste ranges from 80° C. to 110° C., and the curing temperature of the insulating adhesive is no lower than 50° C. and at least lower than the curing temperature of the conductive resin paste.

8. The manufacturing method for an electronic circuit device of claim 7,
wherein the step of forming the circuit board is such that the circuit pattern of at least two-layer configuration is formed by using the conductive resin paste, and an inter-layer insulating film is formed by using insulating resin paste having a curing temperature lower than the curing temperature of the conductive resin paste between layers of the circuit pattern, thereby forming the circuit pattern of multi-layer wiring configuration.

* * * * *